United States Patent [19]

Kudoh

[11] Patent Number: 5,500,863
[45] Date of Patent: Mar. 19, 1996

[54] CRC OPERATIONAL SYSTEM

[75] Inventor: Norimasa Kudoh, Kawasaki, Japan

[73] Assignee: Kabushiki Kaisha Toshiba, Kawasaki, Japan

[21] Appl. No.: 331,877

[22] Filed: Nov. 1, 1994

Related U.S. Application Data

[63] Continuation of Ser. No. 647,935, Jan. 30, 1991, abandoned.

[30] Foreign Application Priority Data

Jan. 30, 1990 [JP] Japan ......................................... 2-19934

[51] Int. Cl.⁶ .................................................. H03M 13/00
[52] U.S. Cl. ......................................... 371/37.1; 371/49.1
[58] Field of Search ................................. 371/37.1, 37.6, 371/37.7, 49.1

[56] References Cited

U.S. PATENT DOCUMENTS

Re. 32,516  10/1987  Cantwell, Jr. ............................... 370/39
4,498,174    2/1985  LeGresley ................................. 371/37.1
4,617,664   10/1986  Aichelmann, Jr. et al. ........... 371/37.7
4,823,347    4/1989  Chin et al. ................................ 371/49.1
5,103,451    4/1992  Fossey ....................................... 371/37.6
5,130,991    7/1992  Takano ...................................... 371/37.6

Primary Examiner—Robert W. Beausolie
Assistant Examiner—Ly V. Hua
Attorney, Agent, or Firm—Finnegan, Henderson, Farabow, Garrett & Dunner

[57] ABSTRACT

A CRC operational system for use in detection of a communication error or the like. A received code sequence is once accumulated, for example, in a shift register so that a message sequence which follows in the shift register $$\sum_{i=0}^{k-1} m_i p^i$$

where, k denotes message length, p=2, and $m_i$=0, 1, is added together taking the $m_i$ into consideration to find a check sequence with respect to the entire message sequence to perform coincidence judgement between the found check sequence and the received check sequence.

5 Claims, 5 Drawing Sheets

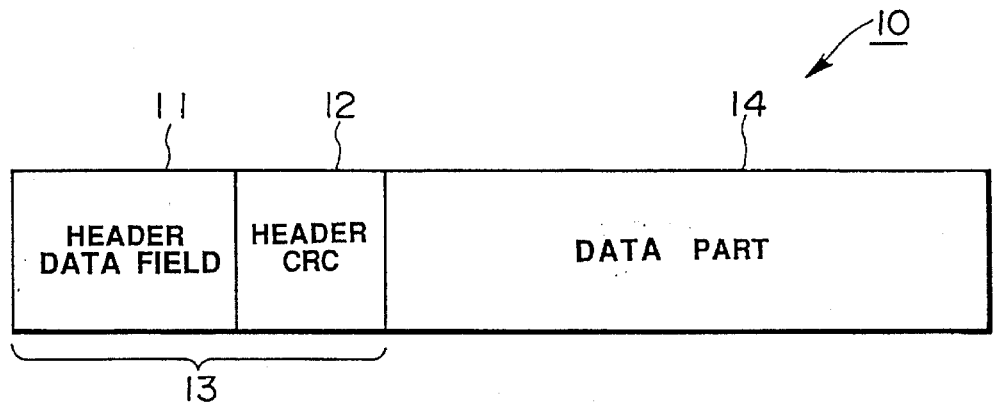
FIG. 3 *(PRIOR ART)*
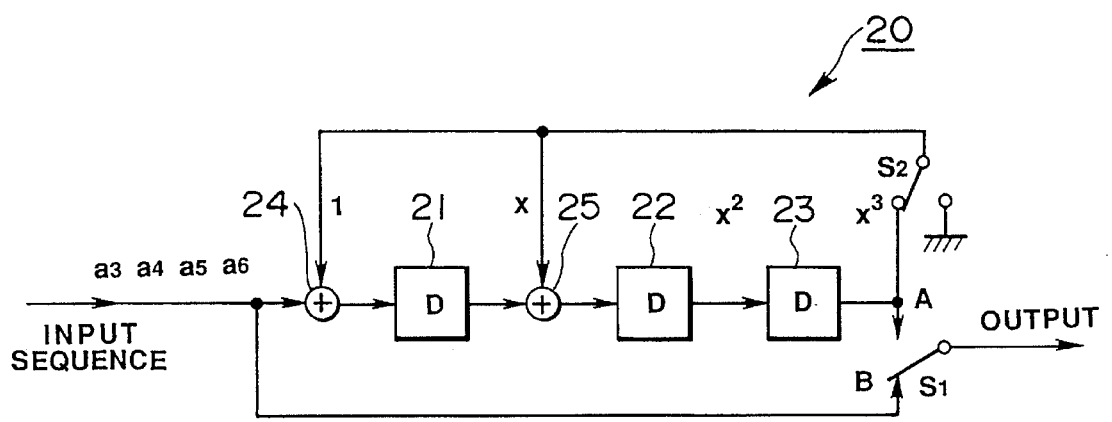
FIG. 4 *(PRIOR ART)*

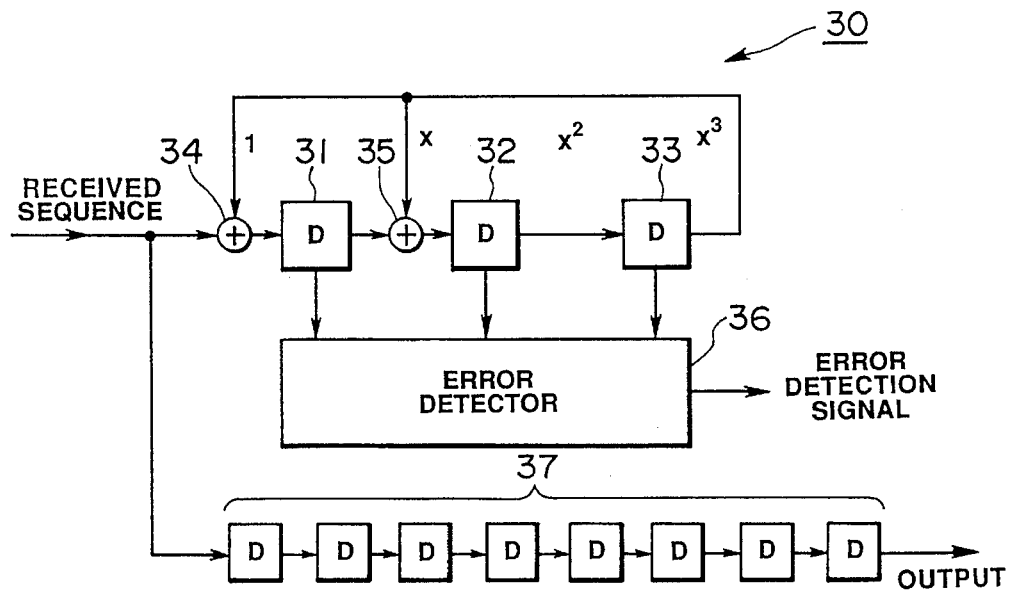
FIG. 5 *(PRIOR ART)*
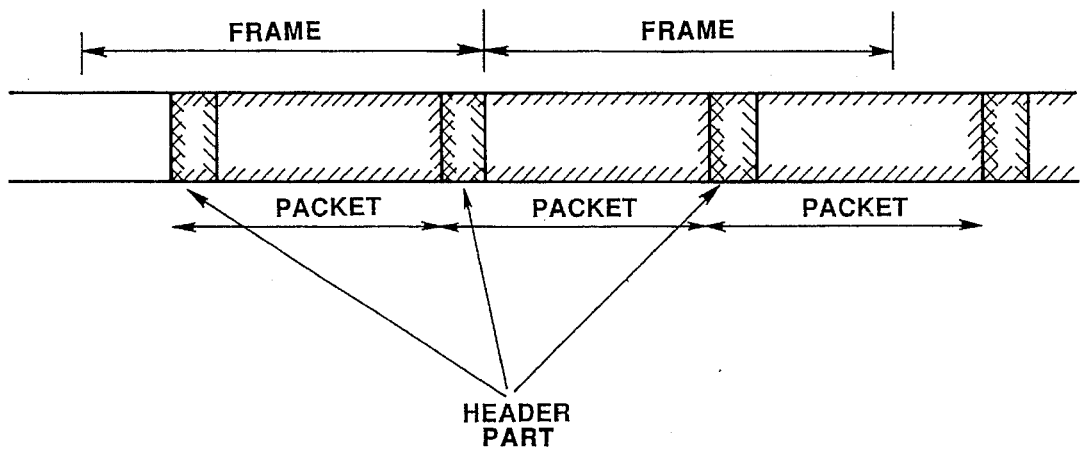
FIG. 6 *(PRIOR ART)*

CRC OPERATIONAL SYSTEM

This application is a continuation of application Ser. No. 07/647,935, filed Jan. 30, 1991, now abandoned.

BACKGROUND OF THE INVENTION

1. Field of the Invention

The present invention relates to a CRC operational system for use in detection of a communication error or the like.

2. Description of the Related Art

An example of a network system for transmitting such data as text, voice or video in the form of a packet is shown in FIG. 2. The network of the drawing includes multiplex lines 1, packet exchanges 2A, 2B and 2C, packet terminals 3A to 3C, exchanges 4A to 4C, and telephone sets 5. When voice data is entered, for example, into the packet terminal 3A, the voice data is converted into coded data, resolved into predetermined units of division data and again assembled into a packet having such header data as party designation data attached thereto at the terminal 3A. The thus-obtained packet is transmitted from the terminal 3A through the packet exchanges 2A and 2B to the party packet terminal 3B.

FIG. 3 shows a data format of a packet 10 on the multiplex line 1. In the drawing, a header data field 11 contains data indicative of a route leading to a party destination and the party destination, and a header CRC field 12 contains a check sequence (CRC code) for checking for the header data field 11 (whether there is an error in the field 11). The header data field 11 and the header CRC field 12 make up a header part 13. As will be appreciated from this explanation, the header CRC field 12 operates only the header data field 11. The header part 13 and a data part 14 make up the packet 10.

On the multiplex line 1, a frame prescribed by the multiplex line 1 is used for transmitting data. For transmitting the fixed-length packet 10, however, a part of the frame other than the parts for a frame synchronization pattern and line maintenance data is used. Since the lengths of the above frame synchronization pattern and line maintenance data generally do not satisfy an integer multiple relationship with the length of the fixed-length packet, it is necessary to detect the position of the packet independently of the frame synchronization.

As one of methods for detecting the packet position, there has been suggested a method which performs a CRC check for a header part and when the check result (syndrome) is zero, determines a position of a packet from which the CRC check started to be a header position of the packet.

FIGS. 4 and 5 show a prior art CRC generation circuit 20 and a prior art CRC check circuit 30 when a polynomial $G(X)=X^3+X+1$ is generated respectively (4 bits of message, 3 bits of check sequence).

The CRC generation circuit 20 of FIG. 4 comprises delay elements 21, 22 and 23, logical exclusive "OR" circuits 24 and 25, and switches $S_1$ and $S_2$. In the CRC generation circuit 20, when the circuit 20 outputs an input sequence without any modification, the switch $S_1$ is switched to its B side and the switch $S_2$ is switched to its feedback side (connected to the exclusive circuits 24 and 25). In the CRC generation circuit 20 when generating and outputting a CRC code, the switch $S_1$ is set to its A side while the switch $S_2$ is set to its 0 input side (ground side).

Meanwhile, the CRC check circuit 30 of FIG. 5 comprises delay elements 31, 32 and 33, logical exclusive "OR" circuits 34 and 35, an error check circuit 36, and a group of delay elements 37. The CRC check circuit 30 computes CRC on the basis of a received sequence and checks whether or not the computed CRC coincides with the received CRC. When a coincidence is found between the computed and received CRCs, the delay elements 31, 32 and 33 have statuses of "0", "0" and "0" respectively. The error detector 36 detects the statuses of the delay elements 31, 32 and 33 and when detecting the statuses of the delay elements 31, 32 and 33 other than "0, 0, 0", externally outputs an error detection signal. In such an error detection mode, the CRC check circuit 30 performs such processing as discarding of the received sequence. In this connection, the received sequence is output as delayed by a time corresponding to 8 bit line clocks, since the received sequence is to be discarded when the group of delay elements 37 detect an error.

For the convenience of explanation, it is assumed hereinafter that the above CRC circuit 20 is used to compute the header CRC 12 of a packet. In the above case, when the computed CRC is expressed in terms of (code length, message length), it is (7 codes, 4 codes).

A flow of packets is shown as an example in FIG. 6. If the syndrome of the CRC check is zero then the CRC-computation starting position is set as the head of the packet, as mentioned above. The CRC check circuit of the receiver side, before computing the CRC, initializes its interior contents (clears the interior contents to zero), and after having received the header part, outputs the syndrome. In other words, one syndrome computation, in this case, requires a time corresponding to 7 bit line clocks, during which the CRC check circuit of the receiver side is occupied by a series of syndrome computation. This means that, when the syndrome is not zero at the current bit position from which the computation starts, a bit position to be next checked corresponds to a position shifted by 8 bits. For this reason, the hunting process for detecting a correct packet position becomes long, thus disadvantageously requiring a lot of time for packet synchronization.

For the purpose of eliminating the above problem, such an arrangement as to provide a plurality of syndrome computation circuits are considered. This however involves another problem that the circuit scale is made large.

As mentioned above, the prior art CRC operational system has had such a problem that, since a considerable amount of bit clock time is used only for a series of syndrome computations, the hunting process necessary for detecting the header position of a packet is made long and thus a synchronization return time is made long.

SUMMARY OF THE INVENTION

It is an object of the present invention to provide a CRC operational system which can eliminate the above problems in the prior art and can realize syndrome computation on a pipeline operational basis with a short hunting process.

In accordance with the present invention, a received code sequence is once accumulated, for example, in a shift register so that a message sequence which follows accumulated in the shift register $$\sum_{i=0}^{k-1} m_i p^i$$

(where, k denotes message length, p=2, and $m_i$=0, 1) is added together taking $m_i$ into account to find a check sequence with respect to the entire message sequence and to perform coincidence judgement between the found check sequence and a received check sequence. With such an arrangement, since the CRC check system occupies only a circuit delay time and does not occupy a large line clock time, a short synchronization return time can be realized.

In the present invention, since the CRC check requires a time corresponding to only the circuit delay, the hunting process for detection of the header position of a packet can be advantageously shortened. Further, since results of the CRC check are accumulated, multi-point monitoring can be achieved, and reduction of the erroneous synchronization process enables reduction of the synchronization establishment time. In addition, since a simple adder tree is employed, the present invention can be easily made favorably in the form of an LSI.

BRIEF DESCRIPTION OF THE DRAWINGS

FIG. 3 shows an example of a packet employed in the network;

FIG. 4 shows a prior art CRC generation circuit;

FIG. 5 shows a prior art CRC check circuit;

FIG. 6 shows a flow of packets; and

DESCRIPTION OF THE PREFERRED EMBODIMENTS

Figure 1:
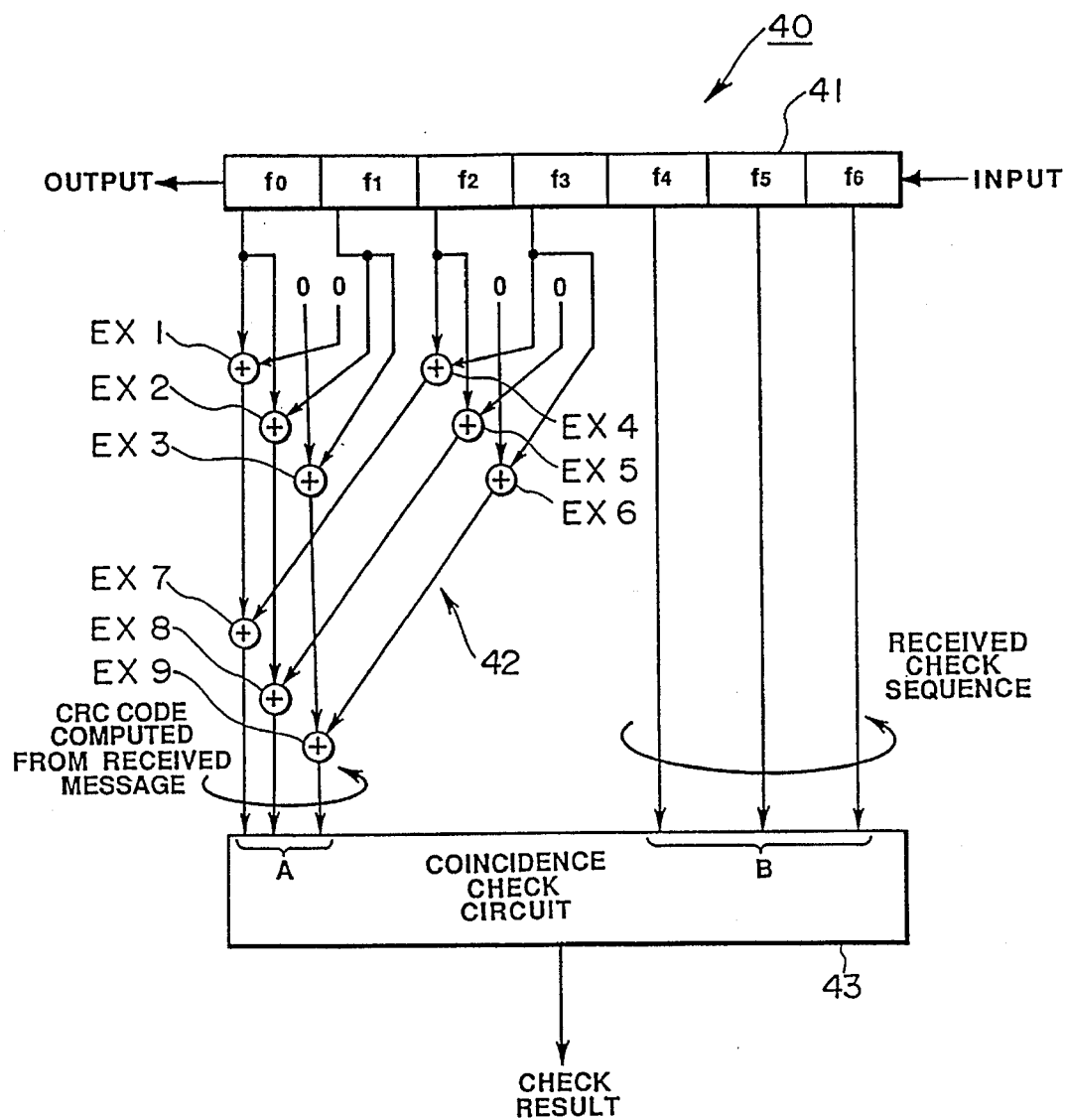
FIG. 1 is a circuit diagram of a CRC operational system in accordance with an embodiment of the present invention.
Figure 2:
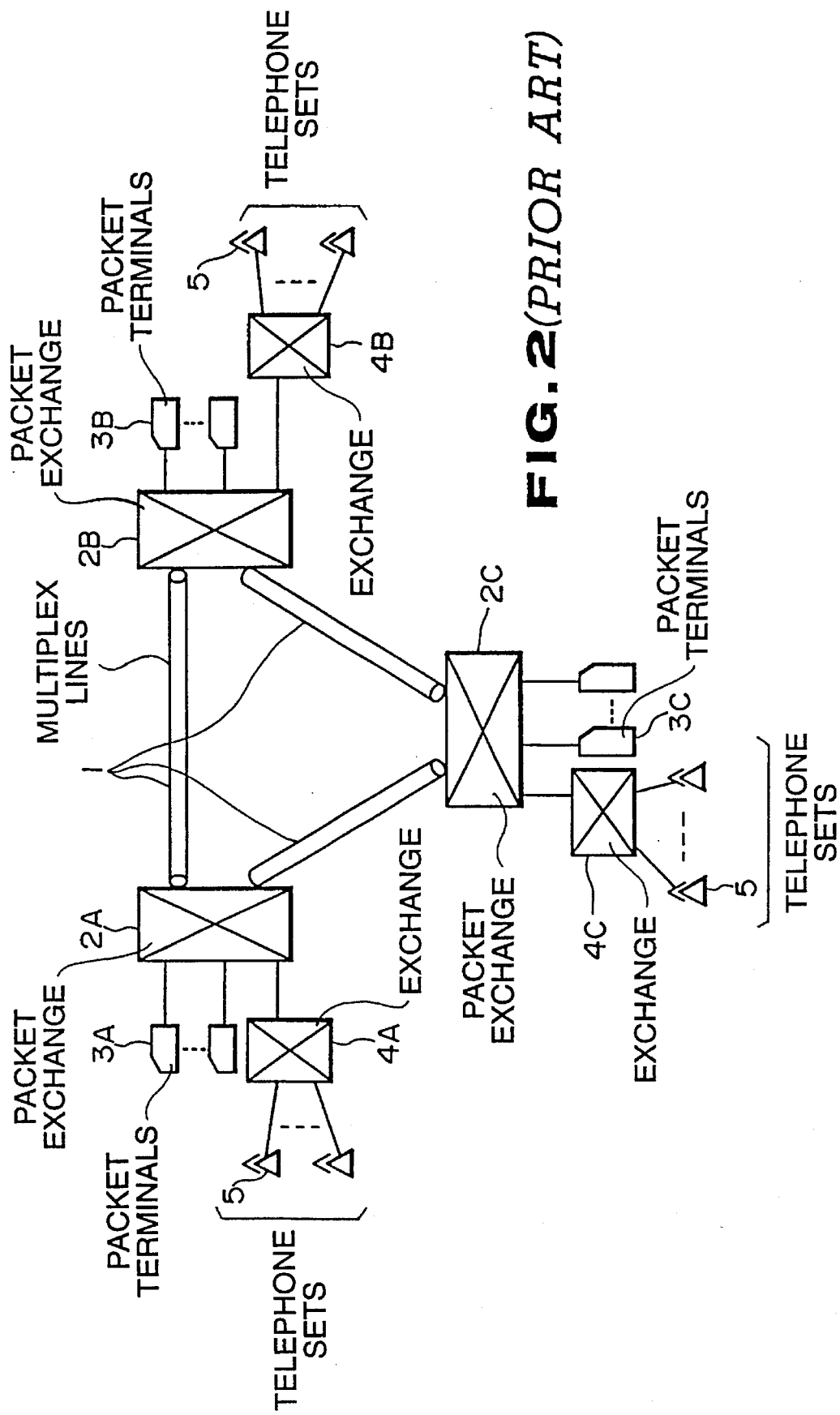
FIG. 2 shows an example of a network employing the CRC operational system of the present invention.

A CRC operational system in accordance with an embodiment of the present invention will be explained in detail.

Explanation will first be made as to the operational principle of the CRC operational system of the present invention. For-the convenience of explanation, explanation will be made in connection with the case where a generating polynomial $G(X)=X^3+X+1$ and a binary code (7, 4) of p=2 are employed. In this case, a message sequence comprises 4 bits and a check sequence comprises 3 bits and thus a code sequence comprises a total of 7 bits (4 bits plus 3 bits). When a 4-bit message sequence m is expressed in terms of $m=(m_0, m_1, m_2, m_3)$ and a 7-bit code sequence F is expressed in terms of $F=(f_0, f_1, \ldots f_6)$, the following equation (1) with the generation matrix G is satisfied.

$$(f_0, f_1, \ldots f_6) = (m_0, m_1, m_2, m_3)G \quad (1)$$

$$G = \begin{matrix} \underbrace{\begin{matrix} 1 & 0 & 0 & 0 \\ 0 & 1 & 0 & 0 \\ 0 & 0 & 1 & 0 \\ 0 & 0 & 0 & 1 \end{matrix}}_{\text{Message}} & \underbrace{\begin{matrix} 1 & 1 & 0 \\ 0 & 1 & 1 \\ 1 & 1 & 0 \\ 1 & 0 & 1 \end{matrix}}_{\text{Check}} \end{matrix} \quad (2)$$

Because of a linear code, a code sequence, for example, for a message (1, 1, 0, 0) becomes (1, 1, 0, 0, 1, 0, 1) which is a sum of code sequences for (1, 0, 0, 0) and (0, 1, 0, 0), that is, a sum (1, 1, 0, 0, 1, 0, 1) of (1, 0, 0, 0, 1, 1, 0) and (0, 1, 0, 0, 0, 1, 1). When this is utilized, CRC can be computed on a pipeline operational basis by using the values of code sequences accumulated, e.g., in a shift register.

There is shown a CRC operational system 40 in accordance with an embodiment of the present invention in FIG. 1, which system comprises a shift register 41 for accumulating a code sequence of data f0 to f6 therein, an adder tree 42 of logical exclusive "OR" circuits EX1 to EX9 prescribed by the generation polynomial G for generating a 3-bit output, and a coincidence check circuit 43. More in detail, the shift register 41 serially receives and serially outputs a packet data including a 4-bit message and a header part having a 3-bit CRC. The stage outputs f0 to f3 of the shift register 41 are applied to the adder tree 42. The CRC is computed on the assumption that the stages f0 to f3 store a received message sequence while the stages f4 to f6 stores a received check sequence. As a matter of course, when the syndrome is not zero, this means that the CRC computation start position does not correspond to the header position of the packet.

In the adder tree 42, the stage output f0 of the shift register 41 is applied to the logical exclusive "OR" circuit EX1 which performs an exclusive "OR" operation of the stage output f0 received from the shift register 41 and "0" preset by the generation sequence G. The stage outputs f0 and f1 of the shift register 41 are applied to the logical exclusive "OR" circuit EX2 which performs an exclusive "OR" operation of the received stage outputs f0 and f1. The stage output f1 of the shift register 41 is applied to the logical exclusive "OR" circuit EX3 which performs an exclusive "OR" operation of the received stage output f1 and a preset logical vale "0". The stage outputs f2 and f3 are applied to the exclusive "OR" circuit EX4 which performs an exclusive "OR" operation of the received stage outputs f2 and f3. The stage output f2 of the shift register 41 is also applied to the exclusive "OR" circuit EX5 which performs an exclusive "OR" operation of the received stage output f2 and a preset logical value "0". The stage output f3 of the shift register 41 is also applied to the exclusive "OR" circuit EX6 which performs an exclusive "OR" operation of the received stage output f3 and a preset logical value "0". Further, the exclusive "OR" circuit EX7 performs an exclusive "OR" operation of outputs of the exclusive "OR" circuits EX1 and EX4, the exclusive "OR" circuit EX8 performs an exclusive "OR" operation of outputs of the exclusive "OR" circuits EX2 and EX5, and the exclusive "OR" circuit EX9 performs an exclusive "OR" operation of outputs of the exclusive "OR" circuits EX3 and EX6. Outputs of the exclusive "OR" circuits EX7, EX8 and EX9 are applied to comparison inputs A of the coincidence check circuit 43.

The stage outputs f4, f5 and f6 of the shift register 41 are applied directly to other comparison inputs B of the coincidence check circuit 43.

The coincidence check circuit 43 detects a coincidence between the outputs of the adder tree 42 received at the comparison inputs A and the stage outputs f4, f5 and f6 of the shift register 41.

In the present embodiment, code $f_i=m_i$ ($i=0–3$) is employed. For example, when $m_0=1$, (1, 1, 0) is input to the adder tree 42; whereas, when $m_i$ ($i=0–3$)=0, (0, 0, 0) is input to the tree. When $m=(1, 1, 0, 0)$ as in the foregoing example, (1, 1, 0), (0, 1, 1), (0, 0, 0) and (0, 0, 0, 0) are input to the adder tree 42, so that a CRC code computed on the basis of the received messages, that is, the output of the adder tree 42 becomes (1, 0, 1). A coincidence between this CRC code and the received check sequence, i.e., between the CRC code and the stage outputs f4, f5 and f6 of the shift register 41 is judged at the coincidence check circuit 43.

In the circuit of the present embodiment, each time the circuit receives data from the line, the CRC check can be carried out in a time corresponding to the circuit delay alone. For this reason, even it is judged that the detected position does not correspond to the header position of the packet at a bit position, the next bit position can be judged and thus the hunting process for synchronization return can be reduced to a large extent.

Figure 7:
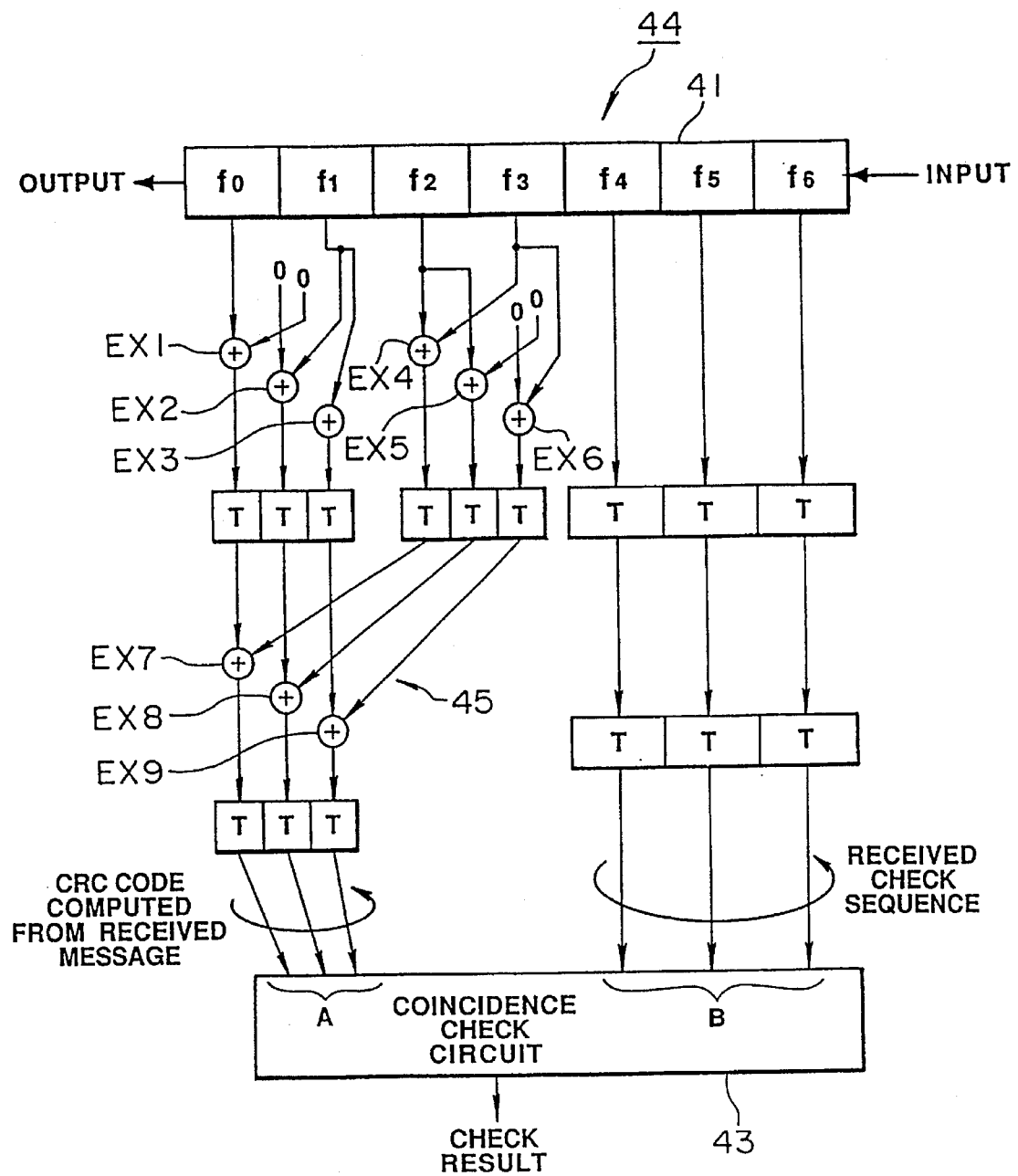
FIG. 7 is a circuit diagram of a CRC operational system in accordance with another embodiment of the present invention.

There is shown an alternative CRC operational system 44 in accordance with another embodiment of the present invention in FIG. 7, which system comprises a shift register 41 for accumulating a code sequence of data $f_o$ to $f_6$ therein, an adder tree 45 of logical exclusive "OR" circuits EX1 to EX9 prescribed by the generation polynomial G for generating a 3-bit output and flip-flop circuits T, and a coincidence check circuit 43.

A difference point between a CRC operational system in FIG. 1 and one in FIG. 7 is that flip-flop T are inserted inside the adder tree and the path in which coincidence check with check sequence is done. It is necessary to perform CRC check in one clock period of line speed. This requires that total delay time of the adder tree is smaller than one clock period of line speed. In the case that line speed is higher than 600 Mbits/sec, it is difficult to achieve this requirement. To achieve this requirement, respective flip-flops T are inserted in each stage of the adder tree. By inserting flip-flops T, the above requirement becomes loose. As the requirement is that delay time of each stage is smaller than one clock period of line speed, it is easier to achieve the requirement.

Additionally note that necessity to insert flip-flops T in each stage is dependent on one clock period of line speed. This indicates that flip-flops T may be inserted in each of two stages and so on.

In addition, many points such as N points can be monitored by accumulating the CRC check results by a bit length corresponding to N packets, and a time until synchronization establishment can be shortened by reducing the erroneous synchronization process.

Furthermore, the logical exclusive "OR" for zero input can be reduced within the adder tree and the circuit size can be reduced.

What is claimed is:

1. A cyclic redundancy check system comprising:

data storing means having an (N+n)-bit storage area for serially receiving and sequentially storing packet data while shifting data storage positions thereof, the packet data having a header part which is composed of an (N+n)-bit code sequence, the (N+n)-bit code sequence being composed of an N-bit message sequence constituting header data and an n-bit check bit sequence following the N-bit message sequence, the n-bit check bit sequence having been obtained by applying a predetermined polynomial to the N-bit message sequence;

an operation circuit for fetching in parallel the N-bit message sequence at an output side of the data storing means when the data storage position of the data storing means is shifted and carrying out an operation specified by the predetermined polynomial so as to calculate as an output an n-bit check bit sequence corresponding to the parallel N-bit message sequence; and coincidence check circuit coupled to said operation circuit and said data storing means for receiving outputs of the operating circuit and the n-bit data at an input side of the data storing means, for checking for coincidence between said outputs and said n-bit data, and for detecting a header position of the packet data at a timing when the coincidence check circuit outputs a coincidence output.

2. A cyclic redundancy check system according to claim 1, wherein the data storing means comprises a shift register which has (N+n) stages and which outputs in parallel the data stored in each of the stages.

3. A cyclic redundancy check system according to claim 1, wherein the operation circuit comprises an adder tree circuit including a plurality of logical exclusive OR circuits which perform calculation of the cyclic redundancy check corresponding to the predetermined polynomial to generate outputs of the adder tree circuit as outputs of the operation circuit.

4. A cyclic redundancy check system according to claim 3, wherein the adder tree circuit comprises:

a plurality of temporary storing means for temporarily storing outputs of the logical exclusive OR circuits, the system further including delay means for inputting the n-bit check bit sequence at the input side of the data storing means to the coincidence check circuit at a timing when outputs are generated from the adder tree circuit.

5. A cyclic redundancy check system according to claim 4, wherein the temporary storing means includes a flip-flop.

* * * * *